United States Patent
Ockenfuss

(10) Patent No.: US 10,222,523 B2
(45) Date of Patent: Mar. 5, 2019

(54) SENSOR DEVICE INCLUDING ONE OR MORE METAL-DIELECTRIC OPTICAL FILTERS

(71) Applicant: Viavi Solutions Inc., Milpitas, CA (US)

(72) Inventor: Georg J. Ockenfuss, Santa Rosa, CA (US)

(73) Assignee: VIAVI Solutions Inc., San Jose, CA (US)

( * ) Notice: Subject to any disclaimer, the term of this patent is extended or adjusted under 35 U.S.C. 154(b) by 0 days.

(21) Appl. No.: 15/269,483

(22) Filed: Sep. 19, 2016

(65) Prior Publication Data

US 2017/0068025 A1 Mar. 9, 2017

Related U.S. Application Data

(63) Continuation of application No. 13/720,728, filed on Dec. 19, 2012, now Pat. No. 9,448,346.

(51) Int. Cl.
| | |
|---|---|
| *G02B 5/20* | (2006.01) |
| *G01J 3/02* | (2006.01) |
| *G01J 3/26* | (2006.01) |
| *G02B 5/28* | (2006.01) |
| *G02B 1/14* | (2015.01) |
| *H01L 27/146* | (2006.01) |

(52) U.S. Cl.
CPC .......... *G02B 5/208* (2013.01); *G01J 3/0256* (2013.01); *G01J 3/0259* (2013.01); *G01J 3/26* (2013.01); *G02B 1/14* (2015.01); *G02B 5/201* (2013.01); *G02B 5/283* (2013.01); *H01L 27/14625* (2013.01)

(58) Field of Classification Search
CPC . G02B 1/10; G02B 5/20; G02B 5/201; G02B 5/207; G02B 5/208; G02B 5/22; G02B 5/28; G02B 5/281; G02B 5/282; G02B 5/283; G02B 5/285
USPC ......... 359/359–361, 577, 580–582, 585–590
See application file for complete search history.

(56) References Cited

U.S. PATENT DOCUMENTS

| | | | |
|---|---|---|---|
| 4,029,394 | A | 6/1977 | Araki |
| 4,979,803 | A | 12/1990 | McGuckin et al. |

(Continued)

FOREIGN PATENT DOCUMENTS

| | | |
|---|---|---|
| CN | 1669332 A | 9/2005 |
| CN | 1227521 C | 11/2005 |

(Continued)

OTHER PUBLICATIONS

Dandin et al., "Optical filtering technologies for integrated fluorescence sensors", The Royal Society of Chemistry, 2007, pp. 955-977.

(Continued)

*Primary Examiner* — Robert E. Tallman
(74) *Attorney, Agent, or Firm* — Harrity & Harrity, LLP

(57) ABSTRACT

A sensor device including one or more sensor elements and one or more optical filters is provided. The one or more optical filters each include a plurality of dielectric layers and a plurality of metal layers stacked in alternation. The metal layers are intrinsically protected by the dielectric layers. In particular, the metal layers have tapered edges that are protectively covered by one or more of the dielectric layers.

20 Claims, 12 Drawing Sheets

(56) References Cited

U.S. PATENT DOCUMENTS

| | | | |
|---|---|---|---|
| 5,120,622 A | 6/1992 | Hanrahan | |
| 5,337,191 A | 8/1994 | Austin | |
| 5,422,730 A | 6/1995 | Barlow et al. | |
| 5,528,082 A | 6/1996 | Ho et al. | |
| 5,587,090 A | 12/1996 | Belcher et al. | |
| 5,648,653 A | 7/1997 | Sakamoto et al. | |
| 5,711,889 A | 1/1998 | Buchsbaum | |
| 5,784,507 A | 7/1998 | Holm-Kennedy et al. | |
| 5,808,293 A | 9/1998 | Yang | |
| 6,031,653 A | 2/2000 | Wang | |
| 6,034,820 A | 3/2000 | Someno et al. | |
| 6,238,583 B1 | 5/2001 | Edlinger et al. | |
| 6,278,540 B1 | 8/2001 | Wang | |
| 6,565,770 B1 | 5/2003 | Mayer et al. | |
| 6,638,668 B2 | 10/2003 | Buchsbaum et al. | |
| 6,783,900 B2 | 8/2004 | Venkataraman | |
| 7,045,471 B2 | 5/2006 | Kobayashi | |
| 7,078,779 B2 | 7/2006 | Wang | |
| 7,079,252 B1 | 7/2006 | Debreezy et al. | |
| 7,119,960 B1 | 10/2006 | Erdogan et al. | |
| 7,133,197 B2 | 11/2006 | Ockenfuss et al. | |
| 7,230,779 B2 | 6/2007 | Kunii | |
| 7,648,808 B2 | 1/2010 | Buchsbaum et al. | |
| 7,875,947 B2 | 6/2011 | Moon et al. | |
| 8,274,051 B1 * | 9/2012 | Aswell | G01J 3/513 250/338.4 |
| 8,300,313 B2 | 10/2012 | Pradhan et al. | |
| 8,587,080 B2 | 11/2013 | Gidon et al. | |
| 8,958,156 B1 | 2/2015 | Erdogan et al. | |
| 9,448,346 B2 | 9/2016 | Ockenfuss | |
| 2003/0103150 A1 | 6/2003 | Catrysse et al. | |
| 2004/0135921 A1 | 7/2004 | Murata et al. | |
| 2005/0068534 A1 | 3/2005 | Kleinfeld et al. | |
| 2005/0185267 A1 * | 8/2005 | Ockenfuss | G02B 5/282 359/359 |
| 2007/0097691 A1 | 5/2007 | Wu | |
| 2008/0055717 A1 | 3/2008 | Prahan et al. | |
| 2008/0316628 A1 * | 12/2008 | Nakajima | B32B 37/24 359/888 |
| 2009/0109537 A1 | 4/2009 | Bright et al. | |
| 2009/0273745 A1 | 11/2009 | Lin | |
| 2009/0302407 A1 | 12/2009 | Gidon et al. | |
| 2010/0067000 A1 | 3/2010 | Baumberg et al. | |
| 2010/0072568 A1 | 3/2010 | Park | |
| 2010/0105035 A1 | 4/2010 | Hashsham et al. | |
| 2010/0201926 A1 | 8/2010 | Lee | |
| 2010/0202734 A1 | 8/2010 | DeCorby | |
| 2011/0204463 A1 * | 8/2011 | Grand | G02B 5/201 257/432 |
| 2012/0044491 A1 * | 2/2012 | Urushidani | G01J 3/0294 356/326 |
| 2012/0085944 A1 * | 4/2012 | Gidon | G02B 5/201 250/553 |
| 2012/0156714 A1 | 6/2012 | O'Brien et al. | |
| 2013/0020503 A1 | 1/2013 | Geddes | |
| 2014/0014838 A1 | 1/2014 | Hendrix et al. | |

FOREIGN PATENT DOCUMENTS

| | | |
|---|---|---|
| CN | 101604700 | 12/2012 |
| DE | 4442045 | 5/1996 |
| JP | S591542407 | 8/1984 |
| JP | H08107107 A | 4/1996 |
| JP | 2001255666 A | 9/2001 |
| JP | 2002023063 A | 1/2002 |
| JP | 2006190958 A | 7/2006 |
| JP | 2006227432 A | 8/2006 |
| JP | 2007219515 A | 8/2007 |
| JP | 2008008975 A | 1/2008 |
| JP | 2008276112 A | 11/2008 |
| JP | 2009545150 A | 12/2009 |
| JP | 2010128259 A | 6/2010 |
| JP | 2011243862 A | 12/2011 |
| JP | 2013015827 A | 1/2013 |
| JP | 2013041027 A | 2/2013 |
| TW | M427564 | 4/2012 |
| WO | WO2007037553 A1 | 5/2007 |

OTHER PUBLICATIONS

Holm-Kennedy et al., "A Novel monolithic, chip-integrated, color spectrometer: The distributed wavelength filter component", Current Developments in Optical Design and Optical Engineering, SPIE vol. 1527, 1991, pp. 323-331.

Whitehurst et al., "Fluorescence-based Implantable Glucose Sensor with Smartphone Interface" presented at the 48th European Association for the Study of Diabetes (EASD) Annual Meeting in Berlin, Germany, T.K. 2012.

Mu et al., "Design and Fabrication of a High Transmissivity Metal-Dielectric Ultraviolet Band-Pass Filter", Appl. Phys. Lett. 102, 2013.

Weidemaier et al., "Multi-Day Pre-Clinical demonstration of Glucose/Galactose Binding Protein-Based Fiber Optic Sensor", Biosensors and Bioelectronics, BIOS-4442, Elsevier B.V., 2011.

Ebbesen et al., "Extraordinary Optical Transmission Through Sub-Wavelength Hole Arrays", Letters to Nature, vol. 391, pp. 667-669, Feb. 12, 1998.

Tao et al., "A Wavelength Demultiplexing Structure Based on Metal-Dielectric-Metal Plasmonic Nano-Capillary Resonators", Optics Express 11111, vol. 18, No. 11, May 24, 2010.

Dobowolski et al., "Metal/Dielectric Transmission Interference Filters With Low Reflectance. 1. Design" Applied Optics, vol. 34, No. 25, pp. 5673-5683, Sep. 1, 1995.

Sullivan et al., "Metal/Dielectric Transmission Interference Filters With Low Reflectance. 2. Experimental Results" Applied Optics, vol. 34, No. 25, pp. 5684-5685, Sep. 1, 1995.

Search Report for corresponding European application No. 13196813.3.

Search Report for corresponding European application No. 13196812.5.

Holm-Kennedy et al., "Novel monolithic chip-integrated color spectrometer: the distributed-wavelength filter component", Proceedings of SPIE, vol. 1527, pp. 322-331, Dec. 1, 1991.

Dandin et al., "Optical filtering technologies for integrated fluorescence sensors", Lab on a Chip, vo. 7, No. 8, p. 955, Jan. 1, 2007.

Webster et al., "Monolithic Capillary Electrophoresis Device With Integrated Fluorescence Detector", Analytical chemistry, American Chemical Society, US, vol. 73, No. 7, pp. 1622-1626, Apr. 1, 2001.

International Search Report from corresponding PCT application No. PCT/US2014/043041.

Partial European Search Report corresponding to EP 14 89 5400, dated Jan. 17, 2018, 12 pages.

Extended European Search Report corresponding to EP 14 89 5400, dated Apr. 18, 2016, 10 pages.

* cited by examiner

| Exemplary Red Filter ||||
| --- | --- | --- | --- |
| Layer No. | Material | Thickness (nm) | Type |
| 1 | H | 430.3 | QWOT |
| 2 | ZnO | 2 | Physical |
| 3 | Ag | 23.82 | Physical |
| 4 | ZnO | 2 | Physical |
| 5 | H | 807.9 | QWOT |
| 6 | ZnO | 2 | Physical |
| 7 | Ag | 31.16 | Physical |
| 8 | ZnO | 2 | Physical |
| 9 | H | 2087.6 | QWOT |
| 10 | ZnO | 2 | Physical |
| 11 | Ag | 31.92 | Physical |
| 12 | ZnO | 2 | Physical |
| 13 | H | 826.4 | QWOT |
| 14 | ZnO | 2 | Physical |
| 15 | Ag | 28.54 | Physical |
| 16 | ZnO | 2 | Physical |
| 17 | H | 455.2 | QWOT |

FIG. 4A

| Exemplary Green Filter | | | |
|---|---|---|---|
| Layer No. | Material | Thickness (nm) | Type |
| 1 | H | 535.9 | QWOT |
| 2 | ZnO | 2 | Physical |
| 3 | Ag | 23.82 | Physical |
| 4 | ZnO | 2 | Physical |
| 5 | H | 634.0 | QWOT |
| 6 | ZnO | 2 | Physical |
| 7 | Ag | 31.16 | Physical |
| 8 | ZnO | 2 | Physical |
| 9 | H | 1688.3 | QWOT |
| 10 | ZnO | 2 | Physical |
| 11 | Ag | 31.92 | Physical |
| 12 | ZnO | 2 | Physical |
| 13 | H | 667.0 | QWOT |
| 14 | ZnO | 2 | Physical |
| 15 | Ag | 28.54 | Physical |
| 16 | ZnO | 2 | Physical |
| 17 | H | 541.8 | QWOT |

FIG. 4B

| Exemplary Blue Filter | | | |
|---|---|---|---|
| Layer No. | Material | Thickness (nm) | Type |
| 1 | H | 248.1 | QWOT |
| 2 | ZnO | 2 | Physical |
| 3 | Ag | 31.01 | Physical |
| 4 | ZnO | 2 | Physical |
| 5 | H | 431.8 | QWOT |
| 6 | ZnO | 2 | Physical |
| 7 | Ag | 33.26 | Physical |
| 8 | ZnO | 2 | Physical |
| 9 | H | 1070.0 | QWOT |

FIG. 4C

| Exemplary Photopic Filter | | | |
|---|---|---|---|
| Layer No. | Material | Thickness (nm) | Type |
| 1 | H | 1444.4 | QWOT |
| 2 | ZnO | 2 | Physical |
| 3 | Ag | 13.47 | Physical |
| 4 | ZnO | 2 | Physical |
| 5 | H | 1782.7 | QWOT |
| 6 | ZnO | 2 | Physical |
| 7 | Ag | 26.41 | Physical |
| 8 | ZnO | 2 | Physical |
| 9 | H | 685.0 | QWOT |
| 10 | ZnO | 2 | Physical |
| 11 | Ag | 27.85 | Physical |
| 12 | ZnO | 2 | Physical |
| 13 | H | 382.9 | QWOT |

FIG. 4D

SENSOR DEVICE INCLUDING ONE OR MORE METAL-DIELECTRIC OPTICAL FILTERS

RELATED APPLICATION

This application is a continuation of U.S. patent application Ser. No. 13/720,728, filed Dec. 19, 2012 (now U.S. Pat. No. 9,448,346), the content of which is incorporated herein by reference.

TECHNICAL FIELD OF THE INVENTION

The present invention relates to a sensor device including one or more optical filters, more particularly, one or more metal-dielectric optical filters.

BACKGROUND OF THE INVENTION

Image sensors are sensor devices that are used in imaging devices, such as cameras, scanners, and copiers, to convert optical signals into electrical signals, allowing image capture. An image sensor, generally, includes a plurality of sensor elements and a plurality of optical filters disposed over the plurality of sensor elements. A color image sensor includes a plurality of color filters disposed in an array, i.e., a color filter array (CFA). The CFA includes different types of color filters having different color passbands, e.g., red, green, and blue (RGB) filters.

Conventionally, absorption filters formed using dyes are used as color filters. Unfortunately, such dye-based color filters have relatively broad color passbands, resulting in less brilliant colors. Alternatively, dichroic filters, i.e., interference filters, formed of stacked dielectric layers may be used as color filters. Such all-dielectric color filters have higher transmission levels and narrower color passbands, resulting in brighter and more brilliant colors. However, the color passbands of all-dielectric color filters undergo relatively large center-wavelength shifts with changes in incidence angle, resulting in undesirable shifts in color.

Furthermore, all-dielectric color filters, typically, include a large number of stacked dielectric layers and are relatively thick. Consequently, all-dielectric color filters are expensive and difficult to manufacture. In particular, all-dielectric color filters are difficult to etch chemically. Lift-off processes are, therefore, preferred for patterning. Examples of lift-off processes for patterning all-dielectric CFAs are disclosed in U.S. Pat. No. 5,120,622 to Hanrahan, issued on Jun. 9, 1992, in U.S. Pat. No. 5,711,889 to Buchsbaum, issued on Jan. 27, 1998, in U.S. Pat. No. 6,238,583 to Edlinger, et al., issued on May 29, 2001, in U.S. Pat. No. 6,638,668 to Buchsbaum, et al., issued on Oct. 28, 2003, and in U.S. Pat. No. 7,648,808 to Buchsbaum, et al., issued on Jan. 19, 2010, which are incorporated herein by reference. However, lift-off processes are, generally, limited to a filter spacing of about twice the filter height, which makes it difficult to achieve all-dielectric CFAs suitable for smaller color image sensors.

In addition to transmitting visible light in color passbands, both dye-based and all-dielectric color filters also transmit infrared (IR) light, which contributes to noise. Therefore, a color image sensor, typically, also includes an IR-blocking filter disposed over the CFA. Conventionally, absorption filters formed of colored glass or dichroic filters formed of stacked dielectric layers are used as IR-blocking filters. Alternatively, induced transmission filters formed of stacked metal and dielectric layers may be used as IR-blocking filters. Examples of metal-dielectric IR-blocking filters are disclosed in U.S. Pat. No. 5,648,653 to Sakamoto, et al., issued on Jul. 15, 1997, and in U.S. Pat. No. 7,133,197 to Ockenfuss, et al., issued on Nov. 7, 2006, which are incorporated herein by reference.

To avoid the use of an IR-blocking filter, induced transmission filters formed of stacked metal and dielectric layers may be used as color filters. Such metal-dielectric color filters are inherently IR-blocking. Typically, metal-dielectric color filters have relatively narrow color passbands that do not shift significantly in wavelength with changes in incidence angle. Furthermore, metal-dielectric color filters are, generally, much thinner than all-dielectric color filters. Examples of metal-dielectric color filters are disclosed in U.S. Pat. No. 4,979,803 to McGuckin, et al., issued on Dec. 25, 1990, in U.S. Pat. No. 6,031,653 to Wang, issued on Feb. 29, 2000, in U.S. Patent Application No. 2009/0302407 to Gidon, et al., published on Dec. 10, 2009, in U.S. Patent Application No. 2011/0204463 to Grand, published on Aug. 25, 2011, and in U.S. Patent Application No. 2012/0085944 to Gidon, et al., published on Apr. 12, 2012, which are incorporated herein by reference.

Typically, the metal layers in metal-dielectric color filters are silver layers, which are environmentally unstable and which deteriorate when exposed to even small amounts of water or sulfur. Chemically etching the silver layers exposes the edges of the silver layers to the environment, allowing deterioration. Therefore, in most instances, metal-dielectric CFAs are patterned by adjusting the thicknesses of only the dielectric layers to select different color passbands for the metal-dielectric color filters. In other words, different types of metal-dielectric color filters having different color passbands are required to have the same number of silver layers as one another and the same thicknesses of the silver layers as one another. Unfortunately, these requirements severely limit the possible optical designs for the metal-dielectric color filters.

The present invention provides metal-dielectric optical filters that are not subject to these requirements, which are particularly suitable for use in image sensors and other sensor devices.

SUMMARY OF THE INVENTION

Accordingly, the present invention relates to a sensor device comprising: one or more sensor elements; and one or more optical filters disposed over the one or more sensor elements, wherein each of the one or more optical filters includes: a plurality of dielectric layers; and a plurality of metal layers stacked in alternation with the plurality of dielectric layers, wherein each of the plurality of metal layers has a tapered edge, at a periphery of the optical filter, that is protectively covered by one or more of the plurality of dielectric layers.

BRIEF DESCRIPTION OF THE DRAWINGS

The present invention will be described in greater detail with reference to the accompanying drawings wherein:

FIG. 4A is a table of layer numbers, materials, and thicknesses for an exemplary red filter;

FIG. 4B is a table of layer numbers, materials, and thicknesses for an exemplary green filter;

FIG. 4C is a table of layer numbers, materials, and thicknesses for an exemplary blue filter;

FIG. 4D is a table of layer numbers, materials, and thicknesses for an exemplary photopic filter;

DETAILED DESCRIPTION OF THE INVENTION

The present invention provides a metal-dielectric optical filter having protected metal layers, which is particularly suitable for use in a sensor device. The optical filter includes a plurality of dielectric layers and a plurality of metal layers stacked in alternation. The metal layers are intrinsically protected by the dielectric layers. In particular, the metal layers have tapered edges that are protectively covered by one or more of the dielectric layers. Accordingly, the metal layers have increased resistance to environmental degradation, resulting in a more durable optical filter.

Figure 1A:
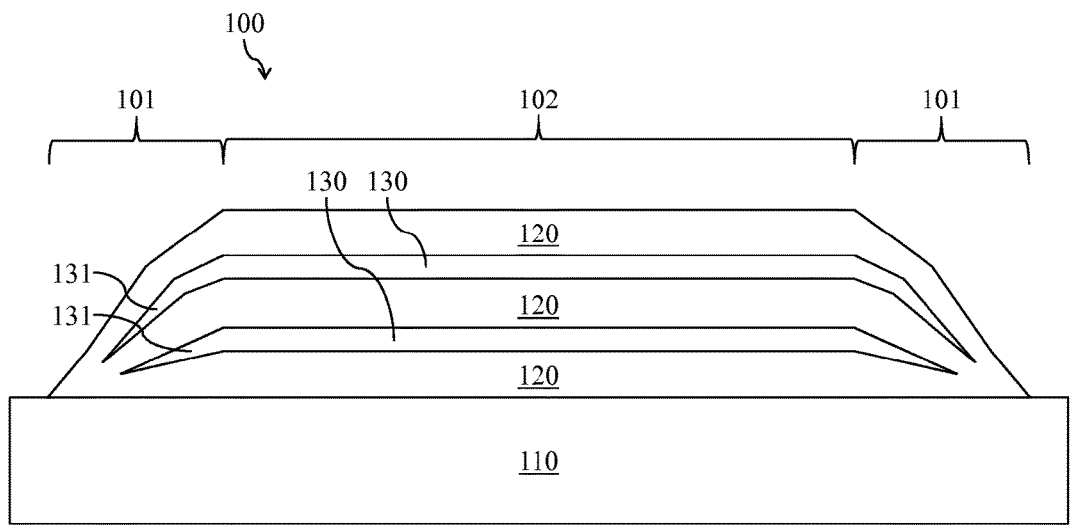
FIG. 1A is a schematic illustration of a cross-section of a first embodiment of an optical filter.

In some embodiments, the dielectric layers and the metal layers are stacked without any intervening layers. With reference to FIG. 1A, a first embodiment of the optical filter 100, disposed on a substrate 110, includes three dielectric layers 120 and two metal layers 130 stacked in alternation. The metal layers 130 are each disposed between and adjacent to two dielectric layers 120 and are, thereby, protected from the environment.

The metal layers 130 have tapered edges 131 at a periphery 101 of the optical filter 100. In other words, the metal layers 130 are substantially uniform in thickness throughout a central portion 102 of the optical filter 100, but taper off in thickness at the periphery 101 of the optical filter 100. Likewise, the dielectric layers 120 are substantially uniform in thickness throughout the central portion 102 of the optical filter 100, but taper off in thickness at the periphery 101 of the optical filter 100. Accordingly, the central portion 102 of the optical filter 100 is substantially uniform in height, whereas the periphery 101 of the optical filter 100 is sloped. In other words, the optical filter 100 has a substantially flat top and sloped sides.

Advantageously, the tapered edges 131 of the metal layers 130 are not exposed to the environment. Rather, the tapered edges 131 of the metal layers 130 are covered by one or more of the dielectric layers 120. The one or more dielectric layers 120 suppress environmental degradation, e.g., corrosion, of the metal layers 130, e.g., by inhibiting the diffusion of sulfur and water into the metal layers 130. Preferably, the metal layers 130 are substantially encapsulated by the dielectric layers 120. More preferably, the tapered edges 131 of the metal layers 130 are protectively covered by adjacent dielectric layers 120, and the metal layers 130 are substantially encapsulated by adjacent dielectric layers 120.

Figure 1B:
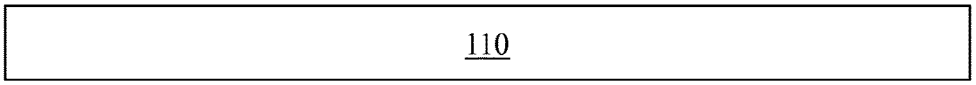
FIGS. 1B to 1G are schematic illustrations of steps in a method of fabricating the optical filter of FIG. 1A.
Figure 1C:
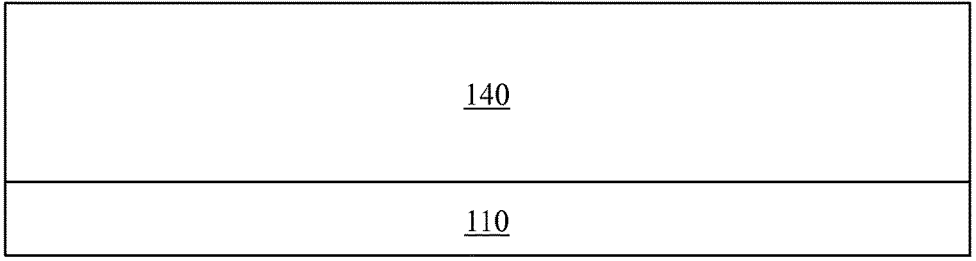

With reference to FIGS. 1B to 1G, the first embodiment of the optical filter 100 may be fabricated by a lift-off process. With particular reference to FIG. 1B, in a first step, the substrate 110 is provided. With particular reference to FIG. 1C, in a second step, a photoresist layer 140 is applied onto the substrate 110. Typically, the photoresist layer 140 is applied by spin coating or spray coating.

Figure 1D:
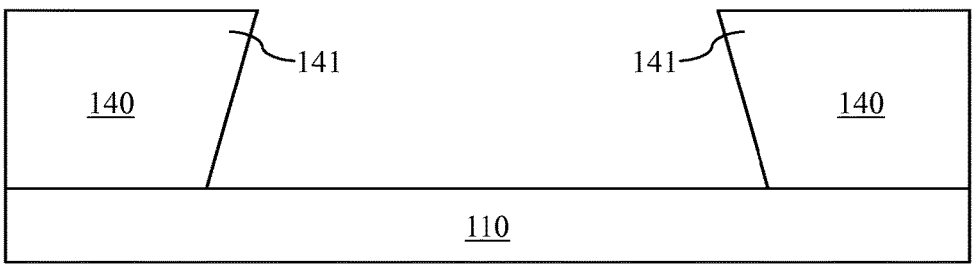

With particular reference to FIG. 1D, in a third step, the photoresist layer 140 is patterned to uncover a region of the substrate 110 where the optical filter 100 is to be disposed, i.e., a filter region. Other regions of the substrate 110 remain covered by the patterned photoresist layer 140. Typically, the photoresist layer 140 is patterned by first exposing a region of the photoresist layer 140 covering the filter region of the substrate 110 to ultraviolet (UV) light through a mask, and then developing, i.e., etching, the exposed region of the photoresist layer 140 by using a suitable developer or solvent.

The photoresist layer 140 is patterned in such a manner that an overhang 141, i.e., an undercut, is formed in the patterned photoresist layer 140 surrounding the filter region. Typically, the overhang 141 is formed by chemically modifying, e.g., by using a suitable solvent, a top portion of the photoresist layer 140, so that the top portion develops more slowly than a bottom portion of the photoresist layer 140. Alternatively, the overhang 141 may be formed by applying a dual-layer photoresist layer 140, consisting of a top layer that develops more slowly and a bottom layer that develops more quickly, to the substrate 110.

Figure 1E:
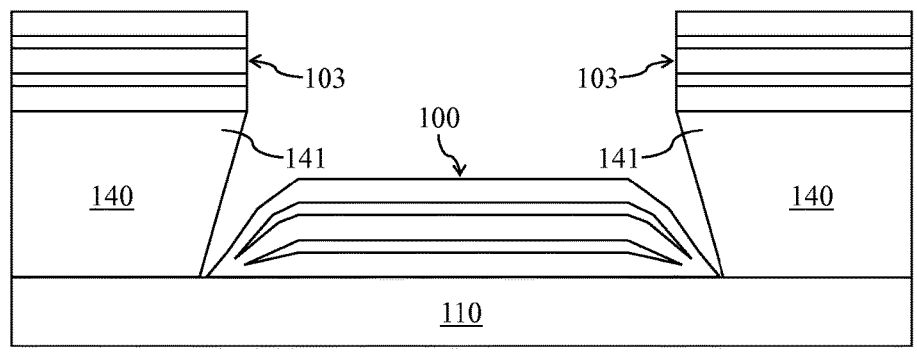

With particular reference to FIG. 1E, in a fourth step, a multilayer stack 103 is deposited onto the patterned photoresist layer 140 and the filter region of the substrate 110. A portion of the multilayer stack 103 disposed on the filter region of the substrate 110 forms the optical filter 100. The layers of the multilayer stack 103, which correspond to the layers of the optical filter 100, may be deposited by using a variety of deposition techniques, such as: evaporation, e.g., thermal evaporation, electron-beam evaporation, plasma-assisted evaporation, or reactive-ion evaporation; sputtering, e.g., magnetron sputtering, reactive sputtering, alternating-current (AC) sputtering, direct-current (DC) sputtering, pulsed DC sputtering, or ion-beam sputtering; chemical vapor deposition, e.g., plasma-enhanced chemical vapor deposition; and atomic layer deposition. Moreover, different layers may be deposited by using different deposition techniques. For example, the metal layers 130 may be deposited by sputtering of a metal target, and the dielectric layers 120 may be deposited by reactive sputtering of a metal target in the presence of oxygen.

Because the overhang 141 shadows a periphery of the filter region of the substrate 110, the deposited layers taper off in thickness towards the periphery 101 of the optical filter 100. When a dielectric layer 120 is deposited onto a metal layer 130, the dielectric layer 120 covers not only the top surface of the metal layer 130, but also the tapered edges 131 of the metal layer 130, thereby, protecting the metal layer 130 from the environment.

Figure 1F:
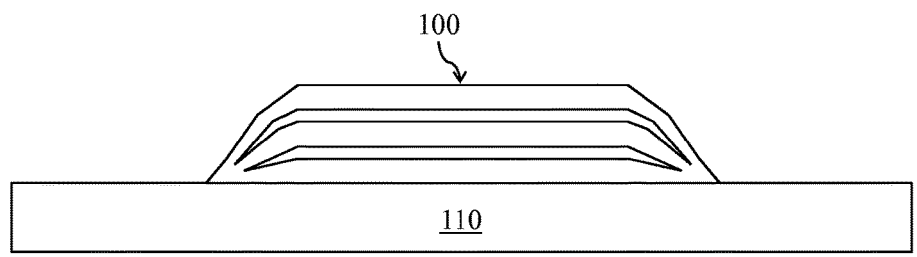

With particular reference to FIG. 1F, in a fifth step, a portion of the multilayer stack 103 on the patterned photoresist layer 140 is removed, i.e., lifted off, together with the photoresist layer 140. Typically, the photoresist layer 140 is stripped by using a suitable stripper or solvent. The optical filter 100 remains on the filter region of the substrate 110. The substrate 110 may, for example, be a conventional sensor element.

It should be noted that the lift-off process of FIGS. 1B to 1F may also be used to simultaneously form a plurality of optical filters 100 of the same type, i.e., having the same optical design, on the substrate 110. Moreover, the lift-off process may be repeated to subsequently form one or more optical filters of a different type, i.e., having a different optical design, on the same substrate 110. Thereby, an optical filter array may be formed on the substrate 110. The substrate 110 may, for example, be a conventional sensor array.

Figure 1G:
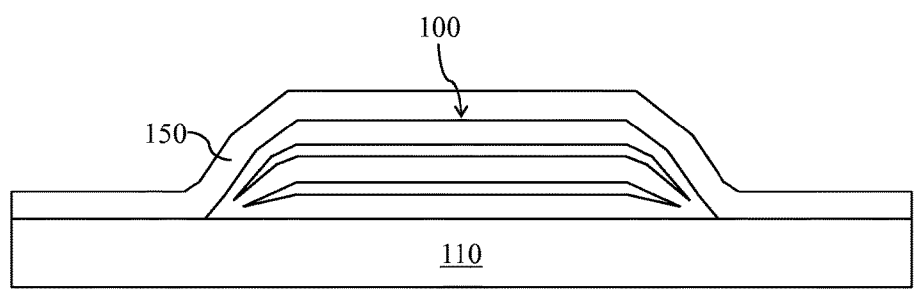

With reference to FIG. 1G, in an optional sixth step, an additional dielectric coating 150 is deposited onto the optical filter 100. The dielectric coating 150 may be deposited by using one of the deposition techniques mentioned heretofore. The dielectric coating 150 covers both the central portion 102 and the periphery 101 of the optical filter 100, i.e., all exposed portions of the optical filter 100, thereby, protecting the optical filter 100 from the environment.

Figure 2:
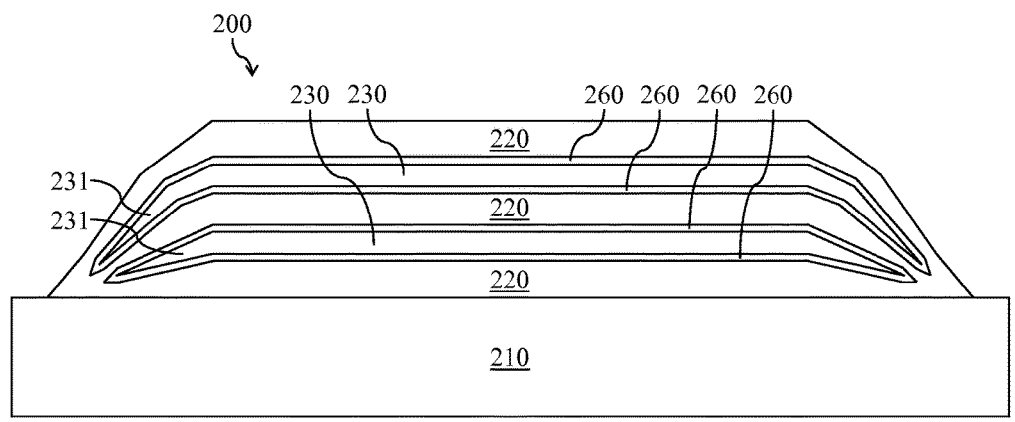
FIG. 2 is a schematic illustration of a cross-section of a second embodiment of an optical filter.

In other embodiments, the optical filter includes a plurality of corrosion-suppressing layers, disposed between the dielectric layers and the metal layers, which further protect the metal layers. With reference to FIG. 2, a second embodiment of the optical filter 200, disposed on a substrate 210, is similar to the first embodiment of the optical filter 100, but further includes four corrosion-suppressing layers 260 inserted between the three dielectric layers 220 and the two metal layers 230.

The metal layers 230 are each disposed between and adjacent to two corrosion-suppressing layers 260 and are, thereby, further protected from the environment. The corrosion-suppressing layers 260 suppress corrosion of the metal layers 230, principally during the deposition process. In particular, the corrosion-suppressing layers 260 protect portions of the metal layers 230 in the optical path, inhibiting degradation of the optical properties of the metal layers 230. Preferably, tapered edges 231 of the metal layers 230 are protectively covered by adjacent corrosion-suppressing layers 260, as well as by nearest dielectric layers 220. Thus, the metal layers 230 are, preferably, substantially encapsulated by adjacent corrosion-suppressing layers 260, as well as by nearest dielectric layers 220.

The second embodiment of the optical filter 200 may be fabricated by a lift-off process similar to that used to fabricate the first embodiment of the optical filter 100. However, the layers of the multilayer stack deposited in the fourth step correspond to the layers of the optical filter 200. In particular, corrosion-suppressing layers 260 are deposited before and after each metal layer 230. Advantageously, the corrosion-suppressing layers 260 suppress corrosion, i.e., oxidation, of the metal layers 230 during deposition of the dielectric layers 220.

The corrosion-suppressing layers 260 may be deposited as metal compound, e.g., metal nitride or metal oxide, layers by using one of the deposition techniques mentioned heretofore. Alternatively, the corrosion-suppressing layers 260 may be formed by first depositing suitable metal layers, by using one of the deposition techniques mentioned heretofore, and subsequently oxidizing the metal layers. Preferably, the corrosion-suppressing layers 260 are each formed by first depositing a suitable metal layer, oxidizing the metal layer, and then depositing a metal oxide layer. For example, the corrosion-suppressing layers 260 may be formed by sputtering of a suitable metal target followed by oxidation, followed by reactive sputtering of a suitable metal target in the presence of oxygen. Further details of methods of forming corrosion-suppressing layers are disclosed in U.S. Pat. No. 7,133,197.

The optical filter of the present invention may have a variety of optical designs. The optical designs of exemplary optical filters will be described in further detail hereafter. In general, the optical design of the optical filter is optimized for a particular passband by selecting suitable layer numbers, materials, and/or thicknesses.

Typically, the optical filter includes 2 to 6 metal layers, 3 to 7 dielectric layers, and, optionally, 4 to 12 corrosion-suppressing layers. In general, increasing the number of metal layers provides a passband with steeper edges, but with a lower in-band transmittance.

The first layer in the optical design, i.e., the first layer deposited on the substrate, may be a metal layer or a dielectric layer. The last layer in the optical design, i.e., the last layer deposited on the substrate, is usually a dielectric layer. When the first layer is a metal layer, the optical filter may consist of n metal layers (M) and n dielectric layers (D) stacked in a sequence of $(M/D)_n$, where n≥2. Alternatively, the optical filter may consist of n metal layers (M), n dielectric layers (D), and 2n corrosion-suppressing layers (C), stacked in a sequence of $(C/M/C/D)_n$, where n≥2. When the first layer is a dielectric layer, the optical filter may consist of n metal layers (M) and n+1 dielectric layers (D) stacked in a sequence of $D(M/D)_n$, where n≥2. Alternatively, the optical filter may consist of n metal layers (M), n+1 dielectric layers (D), and 2n corrosion-suppressing layers (C), stacked in a sequence of $D(C/M/C/D)_n$, where n≥2.

The metal layers are each composed of a metal or alloy. Typically, the metal layers are each composed of silver. Alternatively, the metal layers may each be composed of a silver alloy. For example, a silver alloy consisting essentially of about 0.5 wt % gold, about 0.5 wt % tin, and a balance of silver may provide improved corrosion resistance. Generally, but not necessarily, the metal layers are composed of the same metal or alloy, but have different thicknesses. Typically, the metal layers each have a physical thickness between about 5 nm and about 50 nm, preferably, between about 10 nm and about 35 nm.

The dielectric layers are each composed of a dielectric material. Typically, the dielectric layers are each composed of a high-index dielectric material, i.e., a dielectric material having a refractive index greater than about 1.65 at 550 nm, that is transparent in the visible spectral region. Suitable examples of high-index dielectric materials include titanium dioxide ($TiO_2$), zirconium dioxide ($ZrO_2$), niobium pentoxide ($Nb_2O_5$), tantalum pentoxide ($Ta_2O_5$), and mixtures thereof. Preferably, the high-index dielectric material is also UV-absorbing, i.e., absorbing in the near-UV spectral region. For example, a high-index dielectric material including or consisting of $TiO_2$ and/or $Nb_2O_5$ may provide enhanced UV blocking, i.e., lower out-of-band transmittance in the near-UV spectral region. Preferably, the high-index dielectric material has a refractive index greater than about 2.0 at 550 nm, more preferably, greater than about 2.35 at 550 nm. A higher refractive index is usually desirable. However, the transparent high-index dielectric materials that are currently available, generally, have refractive indices less than about 2.7 at 550 nm.

Generally, but not necessarily, the dielectric layers are composed of the same dielectric material, but have different thicknesses. Typically, the dielectric layers each have a physical thickness between about 20 nm and about 300 nm. This physical thickness is selected to correspond with a quarter wave optical thickness (QWOT) required by an optical design. The QWOT is defined as 4nt, where n is the refractive index of the dielectric material and t is the physical thickness. Typically, the dielectric layers each have a QWOT between about 200 nm and about 2400 nm.

The optional corrosion-suppressing layers are each composed of a corrosion-suppressing material. Typically, the corrosion-suppressing layers are composed of a corrosion-suppressing dielectric material. Examples of suitable corrosion-suppressing dielectric materials include silicon nitride ($Si_3N_4$), $TiO_2$, $Nb_2O_5$, zinc oxide (ZnO), and mixtures thereof. Preferably, the corrosion-suppressing dielectric material is a compound, e.g., a nitride or an oxide, of a metal having a higher galvanic potential than the metal or alloy of the metal layers.

The corrosion-suppressing layers are, generally, suitably thin to substantially avoid contributing to the optical design of the optical filter, especially when they are absorbing in the visible spectral region. Typically, the corrosion-suppressing layers each have a physical thickness between about 0.1 nm and about 10 nm, preferably, between about 1 nm and about 5 nm. Further details of suitable corrosion-suppressing layers are disclosed in U.S. Pat. No. 7,133,197.

The optional dielectric coating is composed of a dielectric material. The dielectric coating may be composed of the same dielectric materials and may have the same range of thicknesses as the dielectric layers. Typically, the dielectric coating is composed of the same dielectric material as the last dielectric layer and has a thickness that is a portion of the design thickness, i.e., the thickness required by the optical design, of the last dielectric layer. In other words, the last dielectric layer of the optical design is split between a dielectric layer and a dielectric coating. For example, if the last dielectric layer has a design thickness $t_d$ and the dielectric coating has a coating thickness $t_c$, e.g., 250 QWOT, the actual thickness $t_a$ of the last dielectric layer is given by: $t_a = t_d - t_c$.

Figure 3:
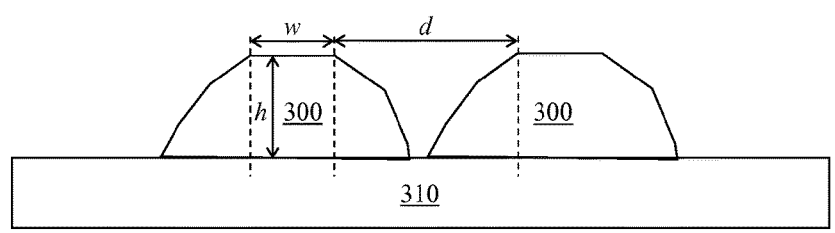
FIG. 3 is a schematic illustration of a cross-section of a plurality of optical filters.

With reference to FIG. 3, the optical filter 300, typically, has a filter height h, i.e., a height of the central portion of the optical filter 300 from the substrate 310, of less than 1 μm, preferably, of less than 0.6 μm. Also typically, the optical filter 300 has a filter width w, i.e., a width of the central portion of the optical filter 300, of less than 2 μm, preferably, of less than 1 μm. Advantageously, the relatively small filter height allows a smaller filter spacing when a plurality of optical filters 300 are formed by a lift-off process. Typically, the optical filters 300 have a filter spacing d, i.e., a spacing between the central portions of nearest optical filters 300, of less than 2 μm, preferably, of less than 1 μm.

The optical filter is a metal-dielectric bandpass filter, i.e., an induced transmission filter, having a high in-band transmittance and a low out-of-band transmittance. Typically, the optical filter has a maximum in-band transmittance of greater than about 50%, an average out-of-band transmittance of less than about 2% between about 300 nm and about 400 nm, i.e., in the near-UV spectral region, and an average out-of-band transmittance of less than about 0.3% between about 750 nm and about 1100 nm, i.e., in the infrared (IR) spectral region. Generally, the optical filter also has a low angle shift, i.e., center-wavelength shift with change in incidence angle from 0°. Typically, the optical filter has an angle shift at an incidence angle of 60° of less than about 5% or about 30 nm in magnitude for an optical filter centered at 600 nm.

In some embodiments, the optical filter is a color filter having a relatively narrow color passband in the visible spectral region. For example, the optical filter may be a red, green, blue, cyan, yellow, or magenta filter. In other embodiments, the optical filter is a photopic filter having a photopic passband, i.e., a passband that mimics the spectral response of the human eye to relatively bright light, in the visible spectral region. In yet other embodiments, the optical filter is an IR-blocking filter having a relatively broad passband in the visible spectral region.

Optical designs, i.e., layer numbers, materials, and thicknesses, for exemplary red, green, and blue filters, i.e., an exemplary RGB filter set, are tabulated in FIGS. 4A, 4B, and 4C, respectively. An optical design for an exemplary photopic filter is tabulated in FIG. 4D. The layers of each optical design are numbered starting from the first layer deposited on the substrate.

The metal layers are each composed of silver, and have physical thicknesses between about 13 nm and about 34 nm. The dielectric layers are each composed of a high-index dielectric material (H), and have QWOTs between about 240 nm and about 2090 nm. For example, the high-index dielectric material may be a mixture of $Nb_2O_5$ and $TiO_2$ having a refractive index of about 2.43 at 550 nm. The corrosion-suppressing layers are each composed of ZnO and each have a physical thickness of about 2 nm.

When the high-index dielectric material has a refractive index of about 2.43 at 550 nm, the filter height of the red filter is 606 nm, that of the green filter is 531 nm, that of the blue filter is 252 nm, and that of the photopic filter is 522 nm. These filter heights are considerably smaller than those of conventional all-dielectric optical filters.

Figure 5A:
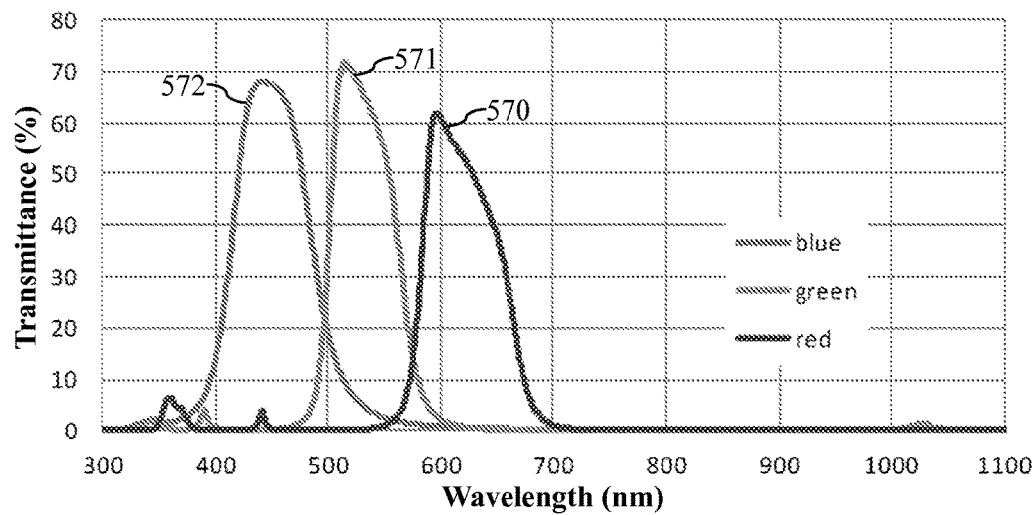
FIGS. 5A and 5B are plots of transmission spectra for the exemplary red, green, and blue filters of FIGS. 4A to 4C.
Figure 5B:
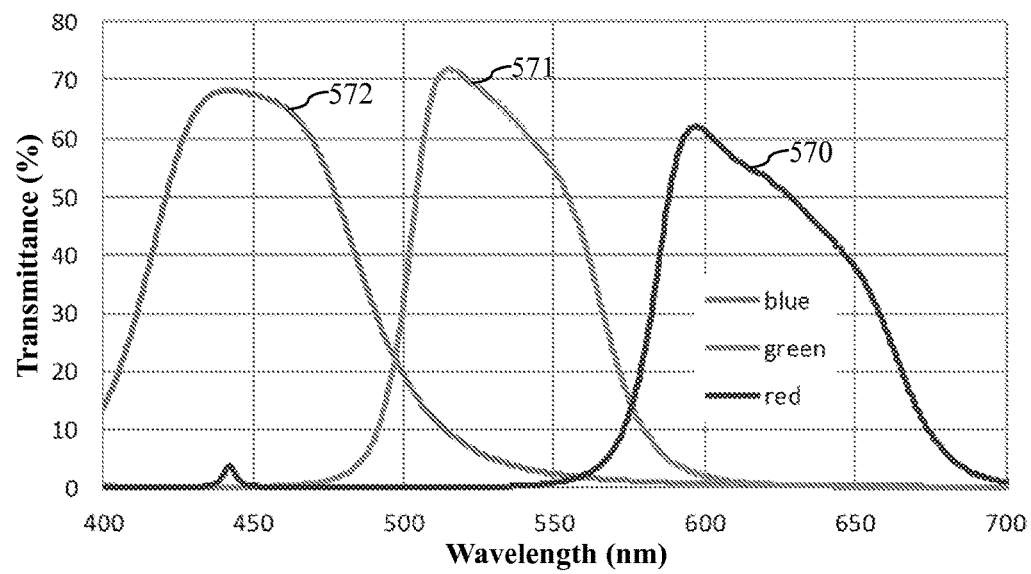

Transmission spectra 570, 571, and 572 for the exemplary red, green, and blue filters are plotted in FIGS. 5A and 5B. The transmission spectrum 570 for the exemplary red filter includes a red passband centered at about 620 nm, the transmission spectrum 571 for the exemplary green filter includes a green passband centered at about 530 nm, and the transmission spectrum 572 for the exemplary blue filter includes a blue passband centered at about 445 nm.

Figure 5C:
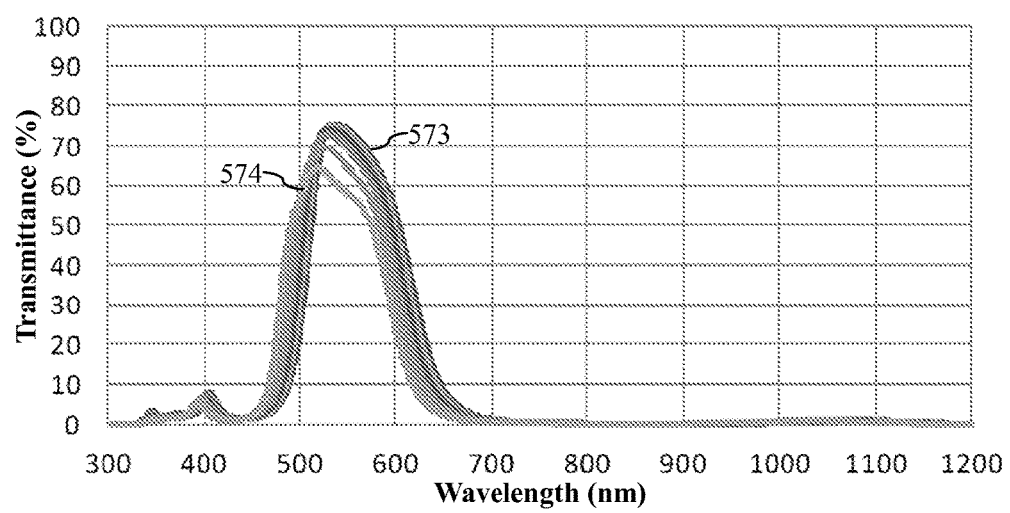
FIG. 5C is a plot of transmission spectra at incidence angles of 0° to 60° for the exemplary photopic filter of FIG. 4D.

Transmission spectra 573 and 574 for the exemplary photopic filter at incidence angles of 0° to 60° are plotted in FIG. 5C. The transmission spectrum 573 for the exemplary photopic filter at an incidence angle of 0° includes a photopic passband centered at about 555 nm. In the transmission spectrum 574 for the exemplary photopic filter at an incidence angle of 60°, the photopic passband is centered at about 520 nm. In other words, the angle shift of the exemplary photopic filter at an incidence angle of 60° is about −25 nm.

The exemplary optical filters each have a maximum in-band transmittance of greater than about 60%. Advantageously, the exemplary optical filters provide improved IR blocking relative to conventional dye-based and all-dielectric optical filters, reducing noise caused by IR leaking. Specifically, the exemplary optical filters each have an average out-of-band transmittance of less than about 0.3% between about 750 nm and about 1100 nm, i.e., in the IR spectral region. The exemplary optical filters, particularly the exemplary red filter, also provide improved UV blocking relative to some conventional metal-dielectric color filters, reducing noise caused by UV leaking Specifically, the exemplary optical filters each have an average out-of-band transmittance of less than about 2% between about 300 nm and about 400 nm, i.e., in the near-UV spectral region.

Figure 6A:
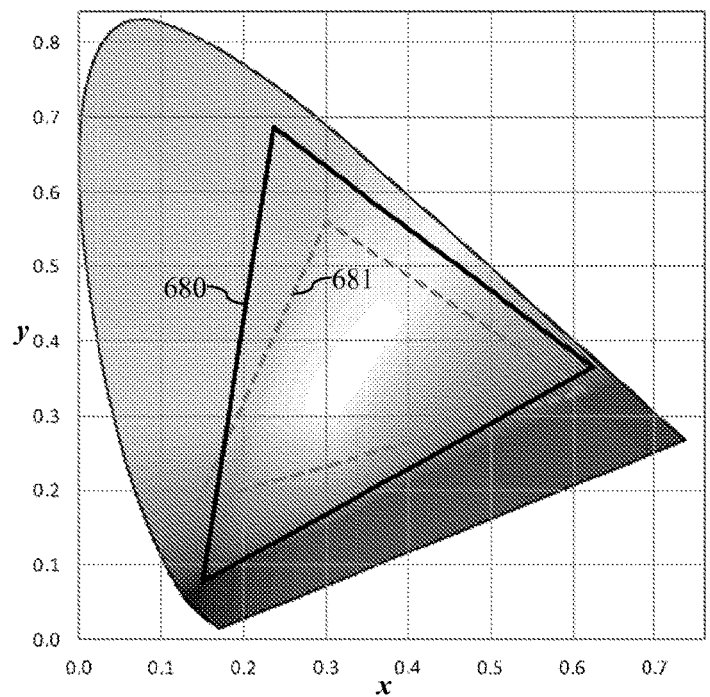
FIG. 6A is a plot of color gamuts for the exemplary red, green, and blue (RGB) filter set of FIGS. 4A to 4C and for a conventional dye-based RGB filter set.

A color gamut 680 for the exemplary RGB filter set is plotted on a CIE xy chromaticity diagram in FIG. 6A, along with a color gamut 681 for a conventional dye-based RGB filter set for comparison. Advantageously, the color gamut 680 of the exemplary RGB filter set is considerably larger than the color gamut 681 of the conventional dye-based RGB filter set.

Figure 6B:
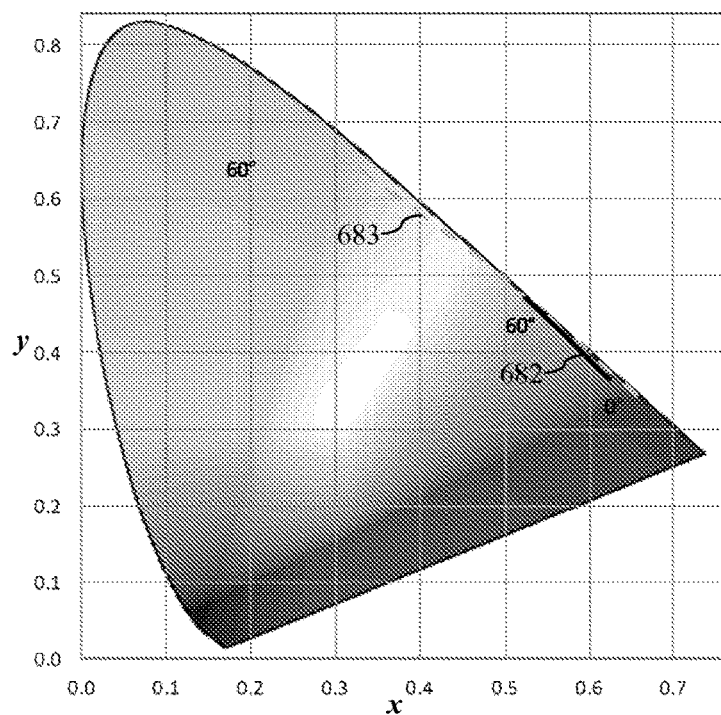
FIG. 6B is a plot of color trajectories at incidence angles of 0° to 60° for the exemplary red filter of FIG. 4A and for a conventional all-dielectric red filter.
Figure 6C:
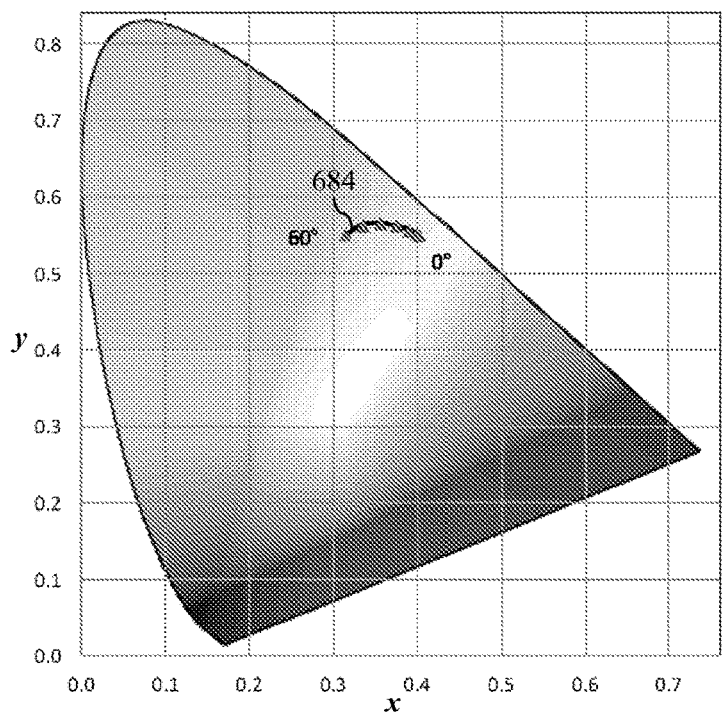
FIG. 6C is a plot of a color trajectory at incidence angles of 0° to 60° for the exemplary photopic filter of FIG. 4D.

A color trajectory 682 for the exemplary red filter at incidence angles of 0° to 60° is plotted on a CIE xy chromaticity diagram in FIG. 6B, along with a color trajectory 683 for a conventional all-dielectric red filter at incidence angles of 0° to 60°. A color trajectory 684 for the exemplary photopic filter at incidence angles of 0° to 60° is plotted on a CIE xy chromaticity diagram in FIG. 6C. Advantageously, the angle shift of the exemplary optical filters is considerably smaller than the angle shift of conventional all-dielectric optical filters.

The optical filter of the present invention is particularly useful when included as part of a sensor device. The sensor device may be any type of sensor device including one or more sensor elements, in addition to one or more of the optical filters of the present invention. For example, the sensor device may be an ambient light sensor, a proximity sensor, or an image sensor. The one or more sensor elements may be any type of conventional sensor elements. Typically, the one or more sensor elements are photodetectors, such as photodiodes, charge-coupled device (CCD) sensor elements, or complementary metal-oxide semiconductor (CMOS) sensor elements. The one or more sensor elements may be front- or back-illuminated.

The one or more optical filters are disposed over the one or more sensor elements, so that the one or more optical filters filter light provided to the one or more sensor elements. Typically, each optical filter is disposed over one sensor element. In other words, each pixel of the sensor device, typically, includes one optical filter and one sensor element. Preferably, the one or more optical filters are disposed directly on the one or more sensor elements. For example, the one or more optical filters may be formed on the one or more sensor elements by a lift-off process. However, in some instances, there may be one or more coatings disposed between the one or more optical filters and the one or more sensor elements.

Figure 7:
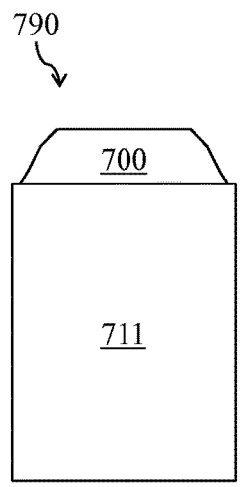
FIG. 7 is a schematic illustration of a cross-section of a first embodiment of a sensor device.

In some embodiments, the sensor device includes a single sensor element and a single optical filter disposed over the sensor element. With reference to FIG. 7, a first embodiment of the sensor device 790 includes a sensor element 711 and an optical filter 700 disposed on the sensor element 711. For example, the sensor device 790 may be an ambient light sensor, the sensor element 711 may be a photodiode, and the optical filter 700 may be a photopic filter, such as the exemplary photopic filter of FIG. 4D, or an IR-blocking filter.

In other embodiments, the sensor device includes a plurality of sensor elements, and a plurality of optical filters disposed over the plurality of sensor elements. Typically, the sensor elements are disposed in an array. In other words, the sensor elements form a sensor array, such as a photodiode array, a CCD array, a CMOS array, or any other type of conventional sensor array. Also typically, the optical filters are disposed in an array. In other words, the optical filters form an optical filter array, such as a color filter array (CFA). Preferably, the sensor array and the optical filter array are corresponding two-dimensional arrays, i.e., mosaics. For example, the arrays may be rectangular arrays having rows and columns.

Usually, the optical filters are substantially separate from one another. In other words, the peripheries of the optical filters are not usually in contact with one another. However, in some instances, the dielectric layers of the optical filters may unintentionally touch, while the metal layers, particularly, the tapered edges, remain separate from one another.

Typically, the plurality of optical filters includes different types of optical filters having different passbands from one another. For example, the plurality of optical filters may include color filters, such as red, green, blue, cyan, yellow, and/or magenta filters, photopic filters, IR-blocking filters, or a combination thereof. In some embodiments, the plurality of optical filters includes different types of color filters, forming a CFA. For example, the plurality of optical filters may include red, green, and blue filters, such as the exemplary red, green, and blue filters of FIGS. 4A to 4C, forming an RGB filter array, such as a Bayer filter array.

Advantageously, the different types of optical filters may have different numbers of metal layers and/or different thicknesses of the metal layers from one another. In some embodiments, at least two of the different types of optical filters include different numbers of metal layers from one another. In the same or other embodiments, at least two of the different types of optical filters have different metal-layer thicknesses from one another. For example, the exemplary blue filter of FIG. 4C has a different number of metal layers from the exemplary red and green filters of FIGS. 4A and 4B. Moreover, all of the exemplary red, green, and blue filters of FIGS. 4A to 4C have different metal-layer thicknesses from one another.

Figure 8:
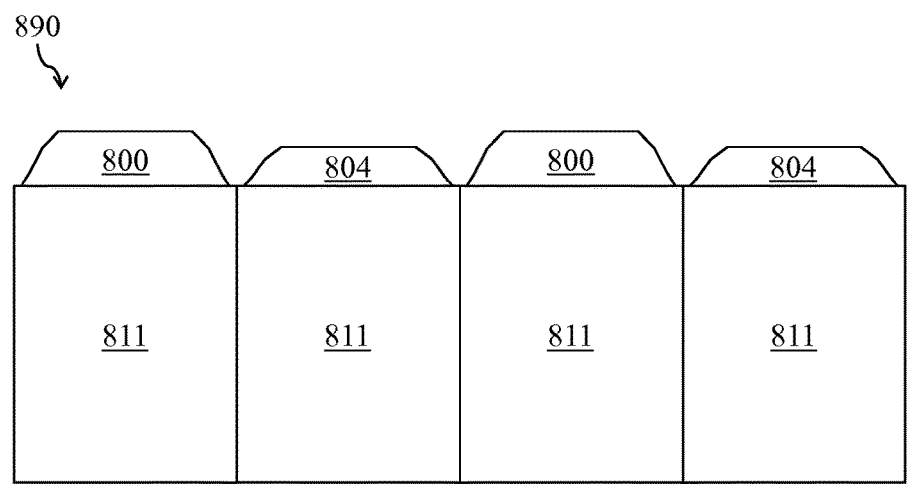
FIG. 8 is a schematic illustration of a cross-section of a second embodiment of a sensor device.

With reference to FIG. 8, a second embodiment of the sensor device 890 includes a plurality of sensor elements 811 and a plurality of optical filters 800 and 804 disposed on the plurality of sensor elements 811. The plurality of optical filters 800 and 804 includes a first type of optical filter 800 having a first passband, and a second type of optical filter 804 having a second passband, different from the first passband. For example, the sensor device 890 may be an image sensor, the plurality of sensor elements 811 may form a CCD array, and the plurality of optical filters 800 and 804 may form a Bayer filter array, of which only a portion of one row is illustrated. The first type of optical filter 800 may be a green filter, such as the exemplary green filter of FIG. 4B, and the second type of optical filter 804 may be a blue filter, such as the exemplary blue filter of FIG. 4C.

Of course, numerous other embodiments may be envisaged without departing from the spirit and scope of the invention.

I claim:

1. An optical filter comprising:
    a plurality of dielectric layers;
    a plurality of metal layers stacked in alternation with the plurality of dielectric layers, wherein
        each of the plurality of dielectric layers has a tapered edge at a periphery of the optical filter,
        each of the plurality of metal layers is encapsulated by one or more of the plurality of dielectric layers, and
        each of the plurality of metal layers is separated from a substrate of the optical filter using at least one of the plurality of dielectric layers; and
    one or more corrosion-suppressing layers substantially encapsulating a metal layer of the plurality of metal layers.

2. The optical filter of claim 1, wherein the optical filter has a substantially flat top and sloped sides.

3. The optical filter of claim 1, wherein each of the plurality of metal layers has a tapered edge, at the periphery of the optical filter, that is encapsulated by one or more of the plurality of dielectric layers.

4. The optical filter of claim 1, where the one or more corrosion-suppressing layers comprise:

a corrosion-suppressing layer disposed between a dielectric layer, of the plurality of dielectric layers, and the metal layer.

5. The optical filter of claim 1, wherein each metal layer, of the plurality of metal layers, is encapsulated by the one or more corrosion-suppressing layers.

6. The optical filter of claim 1, further comprising:
a dielectric coating deposited on the optical filter.

7. The optical filter of claim 1, wherein the optical filter is disposed on a sensor element.

8. The optical filter of claim 7, wherein
the sensor element is one of a plurality of sensor elements, and
the optical filter is one of a plurality of optical filters.

9. The optical filter of claim 8, wherein
the plurality of sensor elements are disposed in a two-dimensional array, and
the plurality of optical filters are disposed in a corresponding two-dimensional array.

10. The optical filter of claim 8, wherein the plurality of optical filters includes different types of optical filters having different passbands.

11. The optical filter of claim 10, wherein at least two of the different types of optical filters have at least one of:
different quantities of metal layers from one another, or
different metal-layer thicknesses from one another.

12. The optical filter of claim 1, wherein the metal layer has a different thickness than at least one other metal layer of the plurality of metal layers.

13. The optical filter of claim 1, wherein each of the plurality of metal layers is composed of silver or a silver alloy.

14. The optical filter of claim 1, wherein each of the plurality of dielectric layers is composed of a high-index dielectric material.

15. The optical filter of claim 14, wherein the high-index dielectric material is ultraviolet-absorbing.

16. The optical filter of claim 1, wherein the optical filter is formed by a lift off process.

17. The optical filter of claim 16, wherein the lift off process includes:
applying a photoresist layer onto the substrate;
patterning the photoresist layer;
depositing a multilayer stack on the patterned photoresist layer;
depositing a multilayer stack on a filter region of the substrate;
removing the photoresist layer; and
removing the multilayer stack deposited on the patterned photoresist layer.

18. The optical filter of claim 17, wherein patterning the photoresist layer includes forming an overhang in the photoresist layer.

19. The optical filter of claim 17, wherein the lift off process further includes:
depositing a dielectric coating on the optical filter.

20. The optical filter of claim 1, wherein each of the one or more corrosion-suppressing layers includes ZnO.

* * * * *